(12) United States Patent
Pearce et al.

(10) Patent No.: US 10,438,848 B2
(45) Date of Patent: Oct. 8, 2019

(54) INORGANIC LIFT-OFF PROFILE PROCESS FOR SEMICONDUCTOR WAFER PROCESSING

(71) Applicant: Semi Automation & Technologies, Inc., Campbell, CA (US)

(72) Inventors: Leon Benton Pearce, Campbell, CA (US); Glenn Anthony Silveira, Santa Clara, CA (US)

(73) Assignee: Semi Automation & Technologies, Inc., Campbell, CA (US)

( * ) Notice: Subject to any disclaimer, the term of this patent is extended or adjusted under 35 U.S.C. 154(b) by 0 days.

(21) Appl. No.: 16/176,272

(22) Filed: Oct. 31, 2018

(65) Prior Publication Data

US 2019/0131168 A1    May 2, 2019

Related U.S. Application Data

(60) Provisional application No. 62/580,115, filed on Nov. 1, 2017.

(51) Int. Cl.
| | | |
|---|---|---|
| *H01L 21/768* | (2006.01) | |
| *G03F 7/16* | (2006.01) | |
| *G03F 7/20* | (2006.01) | |
| *H01L 21/027* | (2006.01) | |
| *G03F 7/26* | (2006.01) | |

(52) U.S. Cl.
CPC .......... *H01L 21/7688* (2013.01); *G03F 7/162* (2013.01); *G03F 7/20* (2013.01); *G03F 7/26* (2013.01); *H01L 21/0272* (2013.01); *H01L 21/0274* (2013.01); *H01L 21/76804* (2013.01)

(58) Field of Classification Search
None
See application file for complete search history.

(56) References Cited

U.S. PATENT DOCUMENTS

| | | | | |
|---|---|---|---|---|
| 5,275,695 | A | * | 1/1994 | Chang ........................ C23F 1/02 216/27 |
| 5,705,432 | A | * | 1/1998 | Lee ..................... H01L 21/0272 257/E21.025 |
| 2007/0087468 | A1 | * | 4/2007 | Doll ..................... H01L 51/0023 438/99 |
| 2017/0125406 | A1 | * | 5/2017 | Price ................... H01L 27/1288 |
| 2018/0190907 | A1 | * | 7/2018 | Kim ..................... H01L 51/0016 |

OTHER PUBLICATIONS

"Life-off (microtechnology" Wikipedia, May 4, 2018, "https://en.wikipedia.org/w/index.php?title=Lift-off_(microtechnology)&oldid=756929607".
"Lift-off Process", eesemi.com, Aug. 4, 2017, "http://eesemi.com/lift-off.htm".
"Lift-Off", noeltech.com, Aug. 4, 2017, "http://www.noeltech.com/pdf/2013/Lift-Off.pdf".

* cited by examiner

*Primary Examiner* — Asok K Sarkar
(74) *Attorney, Agent, or Firm* — Gard & Kaslow LLP

(57) ABSTRACT

An Inorganic Lift-Off-Profile-Process (referred to herein as "ILOPP") is described wherein a portion of a surface inorganic oxide is etched from a substrate oxide surface and under a photoresist edge that supports a sacrificial metal layer. This oxide etched profile under the sacrificial photoresist/metal edge improves Lift-Off of the sacrificial metal layer and delivers smoother, improved metal edge definition in addition to an improved planer surface (flatness) as compared to known LOP technologies.

14 Claims, 16 Drawing Sheets

INORGANIC LIFT-OFF PROFILE PROCESS FOR SEMICONDUCTOR WAFER PROCESSING

This application claims priority from Provisional Application No. 62/580,115, filed on Nov. 1, 2017, which is incorporated by reference herein in its entirety.

FIELD OF THE INVENTION

The present invention relates generally to semiconductor fabrication and, in particular, to lift-off processes used in semiconductor wafer processing.

BACKGROUND OF THE INVENTION

In semiconductor fabrication, thin, defined layers of metal are used to make connections between thousands or millions of components such as transistors. In some processes the metal film layers chosen can be difficult to define by chemical etch (i.e., wet chemicals) or dry etch (i.e., etch gases in a plasma) processes. These metal films are typically less than one micron in thickness and a known process commonly referred to as "Lift-Off" has been used to overcome problems associated with standard wet or dry etch processes.

As one example, and referring now to FIG. 1, after a photoresist layer 102 has been deposited on the semiconductor substrate (e.g., an oxide) 101, shown as Step (A) in the figure, a typical Lift-Off process uses a photolithographic masking process to define the photoresist layer 102, shown as Step (B) in the figure. In such a process, the photoresist is aligned, exposed, and developed using a photo mask. Next, shown as step (C) in the figure, a thin layer of metal 103 is deposited over the entire surface including the photoresist layer 102. The portions of the metal layer 103 that are deposited on the surface of the oxide 101 are commonly referred to as the primary metal layer and the portions of the metal layer 103 that are deposited on top of the photoresist 102 are commonly referred to as the sacrificial metal layer. After this metal deposition process, the semiconductor wafer is placed into a chemical bath solution to dissolve the photoresist 102 and thereby lift-off or remove the sacrificial metal layer of the metal layer 103. The primary metal layer of the metal layer 103 is preserved and remains on the surface of the oxide 101 for subsequent film layers, shown as step (D) in the figure.

In such a Lift-Off Process (hereinafter referred to as "LOP") a profile of the photoresist 102 is sometimes adjusted by developing the photoresist more towards the bottom, down next to the substrate 101 surface, thereby creating sloped sidewalls in the photoresist, shown in the figure as sloped sidewalls 102a and 102b. As is known, these sloped sidewalls minimize the metal deposited on the sidewalls of the photoresist during the subsequent metal deposition step.

There are a number of known processing issues that affect this sloped sidewall and efficiency of the LOP during film separation of the primary and sacrificial metal layers during the Lift-Off process. Some of these issues are caused by changes in photoresist sidewall angles due to temperatures variations during metal deposition. Too high of a deposition temperature can soften the photoresist and change the sidewall angle. As is known, photoresist with high thermal stability should be used for LOP. Tool design can also affect the amount of metal deposited on the sidewalls during deposition of the metal layer. Tools (e.g., Electron Beam and Sputtering) that can provide depositions normal (i.e., orthogonal) to the substrate surface, otherwise known as vertical, work best. If too much metal is deposited on the sidewalls of the photoresist, poor edge line definition, bridging metal called "Fences", and reduced chip yields occur. If the metal deposition on the sidewalls becomes too thick, the sacrificial metal can be very hard or impossible to remove during LOP, which causes other known problems (e.g., portions of metal are left standing upwards from the substrate surface, a condition known as "ears").

For these and other reasons, there is a need for an improved LOP that avoids these and other issues.

SUMMARY OF THE INVENTION

One embodiment discloses a semiconductor fabrication method comprising: depositing a first layer of oxide on a semiconductor substrate; depositing a first layer of photoresist on the first layer of oxide; masking and developing the first layer of photoresist thereby exposing a surface of the first layer of oxide; etching the exposed surface of the first layer of oxide thereby creating an undercut area under an edge of the first layer of photoresist; depositing a layer of metal on the exposed surface of the first layer of oxide and on the first layer of photoresist with a discontinuity therebetween; removing the first layer of photoresist and the layer of metal on the first layer of photoresist using a Lift-Off process; depositing a second layer of oxide on the layer of metal on the exposed surface of the first layer of oxide and on the first oxide layer; depositing a second layer of photoresist on the second layer of oxide; masking and developing the second layer of photoresist down thereby exposing a surface of the second layer of oxide; etching the exposed surface of the second layer of oxide down to the metal layer thereby creating a contact area on the metal layer; and, removing the second layer of photoresist.

DETAILED DESCRIPTION OF THE INVENTION

Described herein is a new Inorganic Lift-Off-Profile-Process (referred to herein as "ILOPP"). In this new ILOPP, a portion of a surface inorganic oxide is etched from the substrate oxide surface and under a photoresist edge that supports a sacrificial metal layer. This oxide etched profile under the sacrificial photoresist/metal edge provides a significant improvement at Lift-Off of the sacrificial metal layer and delivers smoother, improved metal edge definition in addition to an improved planer surface (flatness) as compared to the known LOP technologies.

As has been explained, known LOP technologies adjust the photoresist profile wall (i.e., the organic photoresist) by the exposure and development times to create a sloped photoresist sidewall in an effort to minimize sidewall metal deposition.

ILOPP by contrast, and as will be explained in greater detail, creates an undercut sloped profile in the oxide under the photoresist edge by removing (i.e., etching out) a portion of the surface oxide. In other words, the ILOPP technology uses etched films to adjust the edge profiles to create undercuts whereas the standard LOP technology instead merely adjusts the photoresist sidewall profiles.

Figure 1:
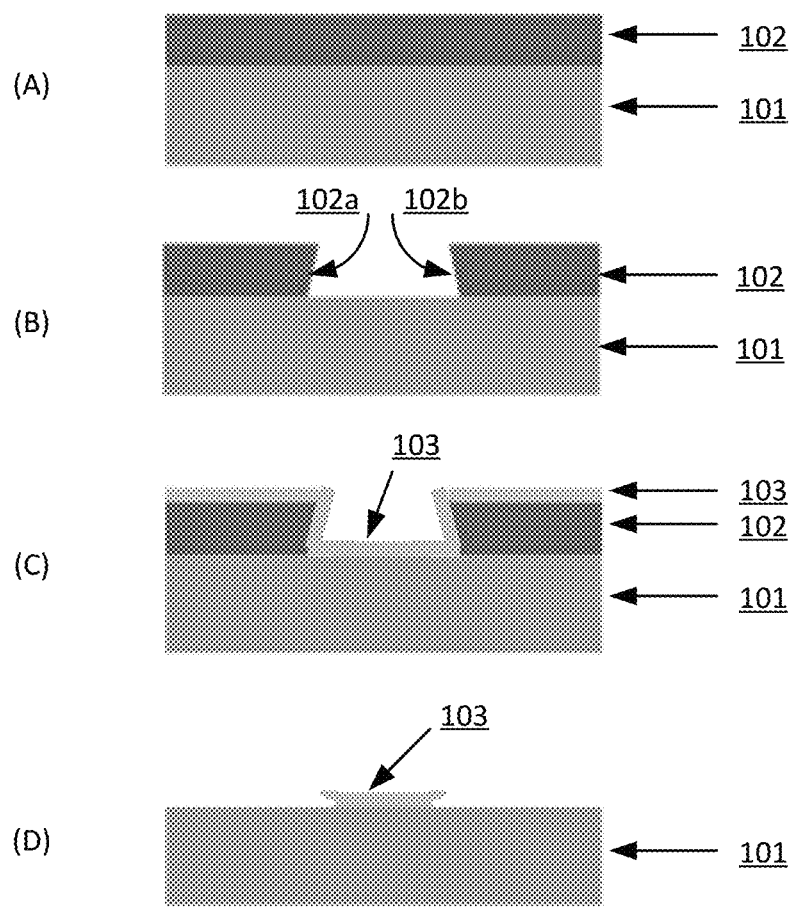
FIG. 1 is an illustration of an example prior art Lift-Off Process ("LOP").

This new ILOPP technique is able to solve many of the problems associated with multilayer stacks of metals in standard LOP processes. As is known with existing Lift-Off processes and as was explained with reference to FIG. 1, the deposited primary metal layer remains on the surface of the oxide and the sacrificial metal layer on the photoresist is developed off and removed. This sacrificial metal layer removal occurs because the photoresist is dissolved under the metal during the Lift-Off process. This new ILOPP process improves the Lift-Off of the sacrificial layer by first etching an inorganic oxide, creating an undercut in the oxide, which is under the edge of the photoresist. This undercut in the oxide and under the photoresist edge creates a discontinuity or separation between the primary and sacrificial metal layers during subsequent metal deposition. This discontinuity or separation causes a very efficient separation of the primary and sacrificial metals during the subsequent Lift-Off process.

As would be understood by one of skill in the art in light of the teachings herein, this new ILOPP process is also a way to define complex multi-layers of deposited metals. Existing approaches to defining multi-layer stacks of different metals can create major processing problems during metal Lift-Off causing non-uniform ragged edges, shorts, and poor metal definition. In contrast, this new ILOPP process reduces these processing defects and gives high edge quality with smooth, rounded edges not found using existing LOP approaches.

This new ILOPP approach will now be explained in greater detail. Before deposition of the metal layer and after the photoresist masking process, an undercut profile is generated by etching an inorganic oxide layer under the sacrificial photoresist layer. This etching of the oxide generates a separation or discontinuity between the primary and sacrificial metal layers during the subsequent metal deposition process. This separation between the primary and sacrificial metals occurs because the deposited metal particles are more normal, i.e., orthogonal or vertical, to the surface of the substrate oxide and cannot deposit efficiently under and around the corners of this undercut at the photoresist edge. The primary and sacrificial deposited metals get effectively separated, which makes for an efficient metal Lift-Off at this point. This is because the metal deposited during the deposition is masked by the undercut of the photoresist edge resulting in a highly defined smooth metal edge that tapers to zero thickness under the photoresist edge. The metal deposition is very inefficient in depositing under the edge of the photoresist but does deposit some as it follows up the tapered oxide under the photoresist edge. Further, this deposited metal under the photoresist edge increases the metal line width by a small amount. This new ILOPP approach will now be explained with reference to various figures.

Figure 2:
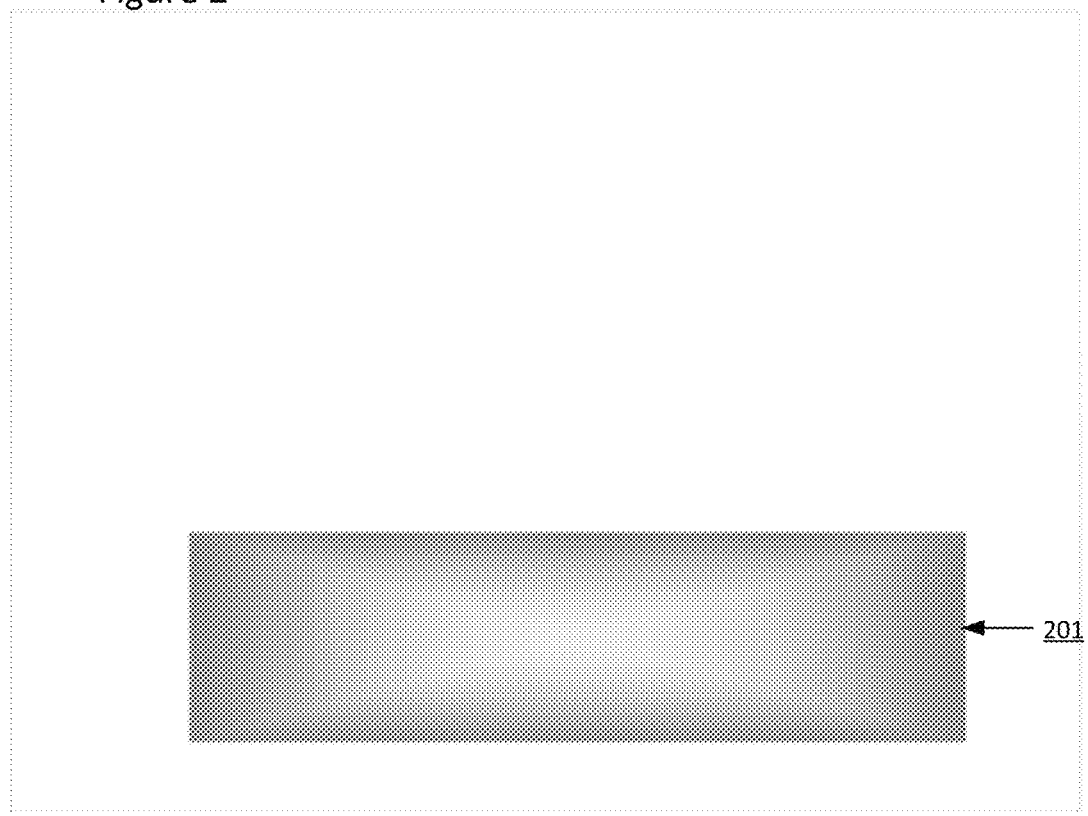
FIGS. 2 through 13 are an example illustration of an Inorganic Lift-Off Profile Process ("ILOPP") according to one or more embodiment.

Referring now to FIG. 2, a standard silicon substrate 201 can be seen. The substrate 201 chosen for this illustration is silicon but could be any number of materials to support a film. Therefore the substrate could be Glass, Ceramic, Quartz, Silicon-on-Insulator ("SOT"), Sapphire, Gallium Arsenide ("GaAs"), or other types of material.

Figure 3:
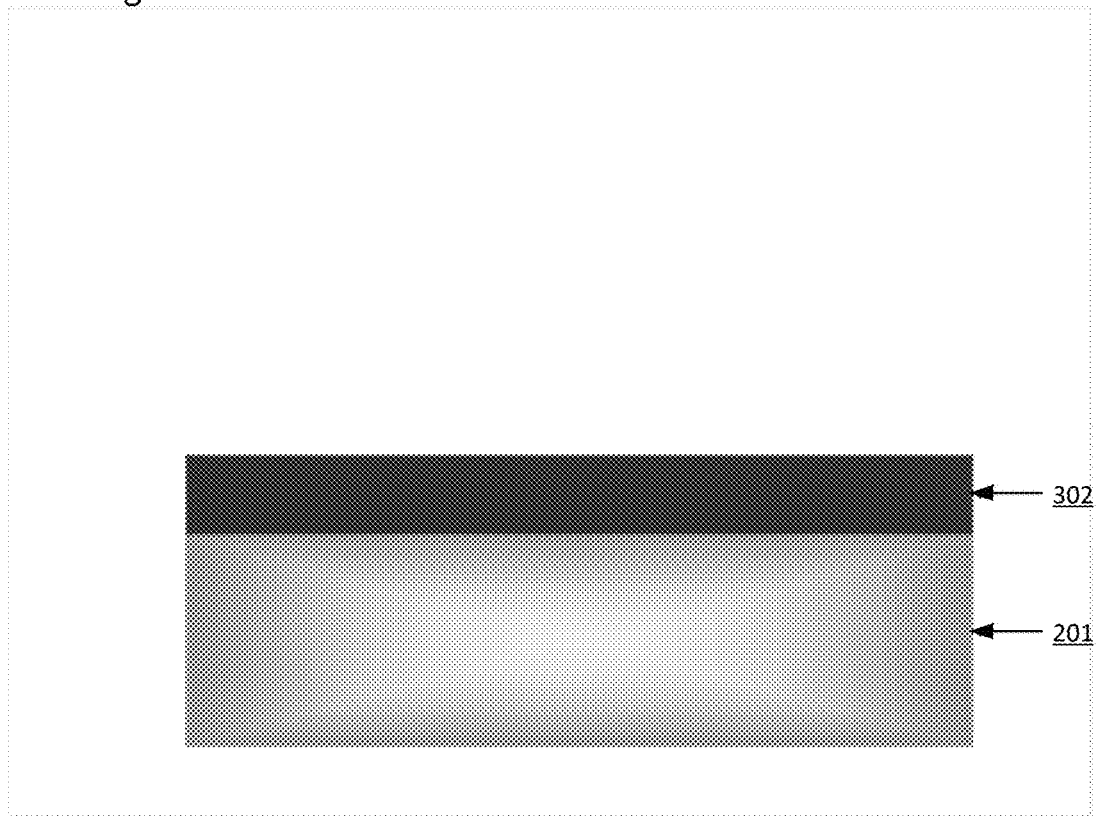

Referring now to FIG. 3, a layer of oxide 302 is shown having been deposited on the substrate 201. In this example, the film on this substrate is a thermally grown inorganic oxide however it is to be understood that a Chemical Vapor Deposition ("CVD") oxide or any number of other films could be used so long as they can be deposited masked, etched, and defined.

Figure 4:
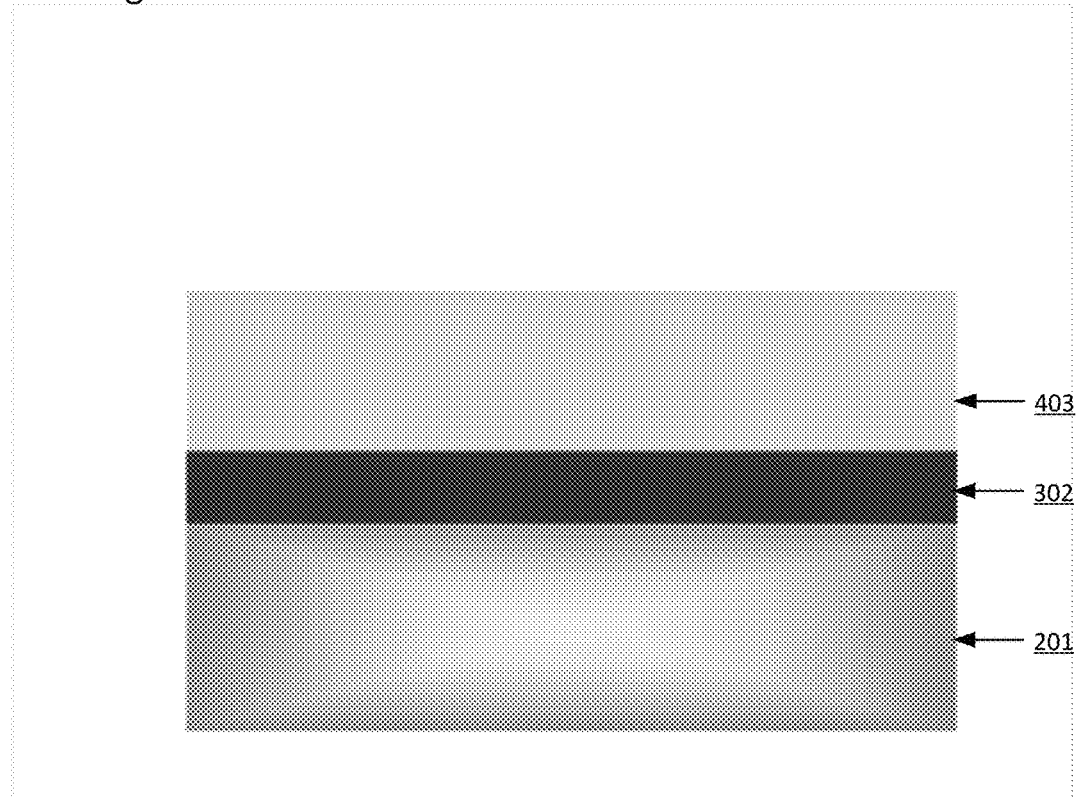

Referring now to FIG. 4, a layer of photoresist 403 is shown as having been coated on the oxide layer 302 using a photoresist spinner.

Figure 5:
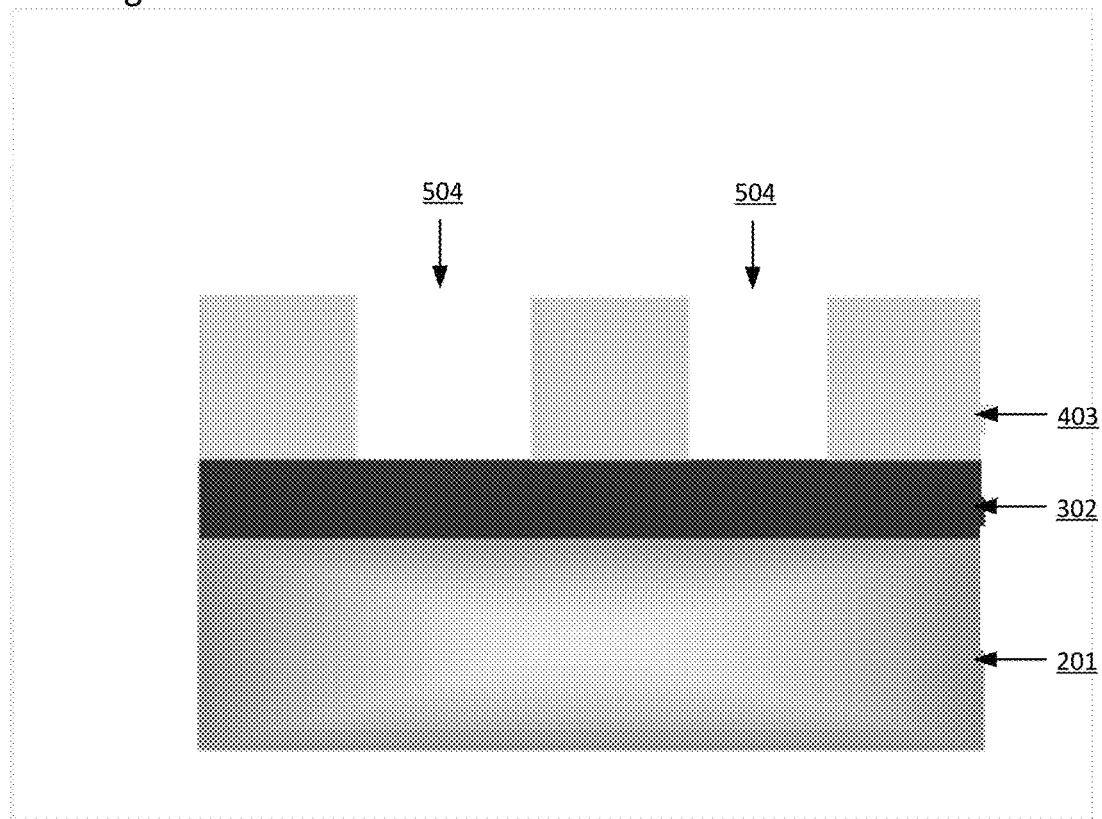

Referring now to FIG. 5, the photoresist 403 is shown as having been masked and developed out 504 down to the surface of the oxide 302. This masking process exposes and develops the photoresist film 403 leaving the image of the mask that was used during exposure.

It is to be noted that the photoresist thickness or type used for this new Lift-Off process is not a critical factor as long as it has well defined edges and reasonable adhesion to the oxide layer. Further, it is recommended that the photoresist used should have a high thermal stability to keep the original profile through metal deposition. Determining these factors is within ordinary skill in the art in light of the teachings herein.

Figure 6:
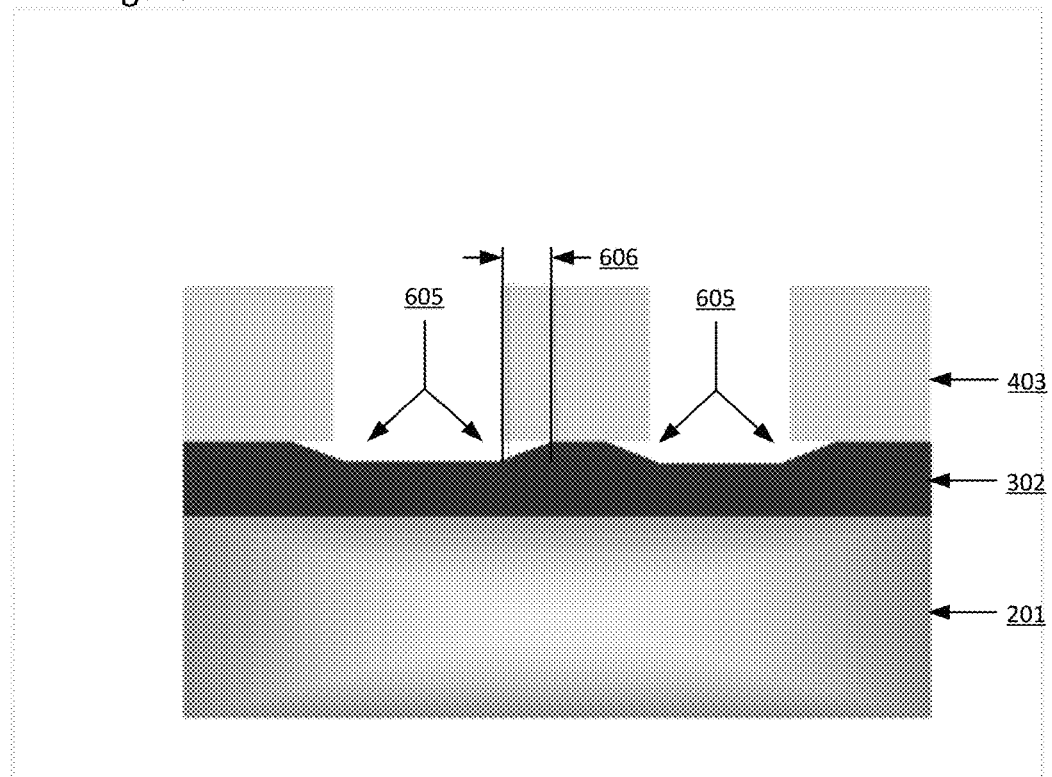
Figure 6A:
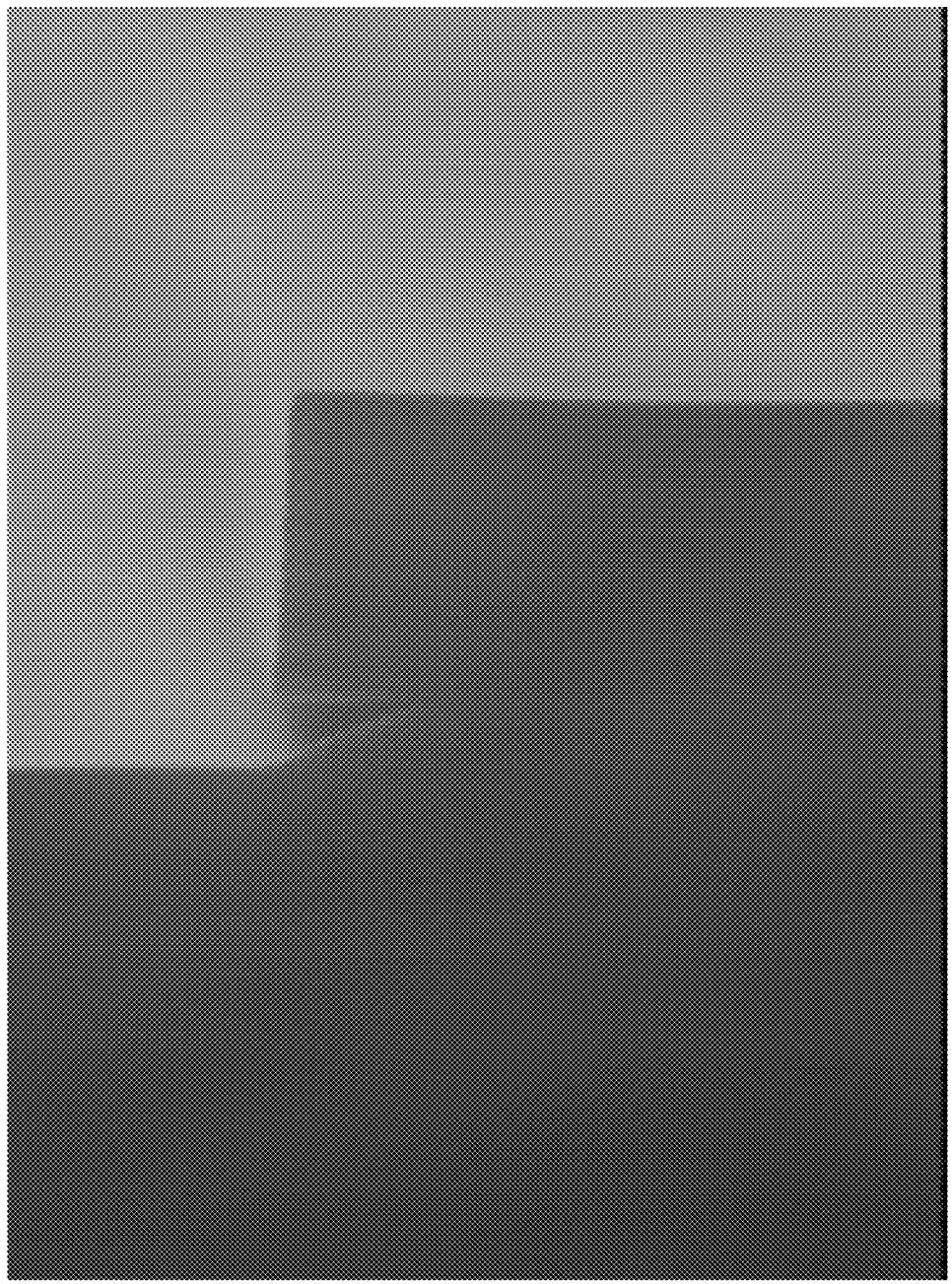

Referring now to FIG. 6, areas of oxide 302 are shown as having been etched out from the surface of the oxide to create undercut areas 605 under the edge of photoresist 403. These undercut areas 605 occur by the wet etching of the exposed surface oxide 302 for an etched depth and lateral (i.e., horizontal or sideways) distance 606 under the photoresist 403. In a preferred embodiment, the depth etched in the orthogonal to the surface of oxide 302 (or vertical) direction of the oxide should be similar to the metal thickness being deposited. The oxide etch solution used in this example was Buffered Oxide Etch ("BOE"), which is a mixture of 7 parts of ammonium fluoride acid to 1 part of 48% hydrofluoric acid. However, different oxide etch solutions can be used so long as the oxide is etched isotropically (i.e., in both directions), which ensures the etching occurs both downwards and sideways. BOE normally etches only the oxide surface and not the photoresist film. The result of the oxide etching is an undercut area 605 under the edge of the photoresist 403 as shown in the Scanning Electron Microscope ("SEM") image of FIG. 6A.

Figure 7:
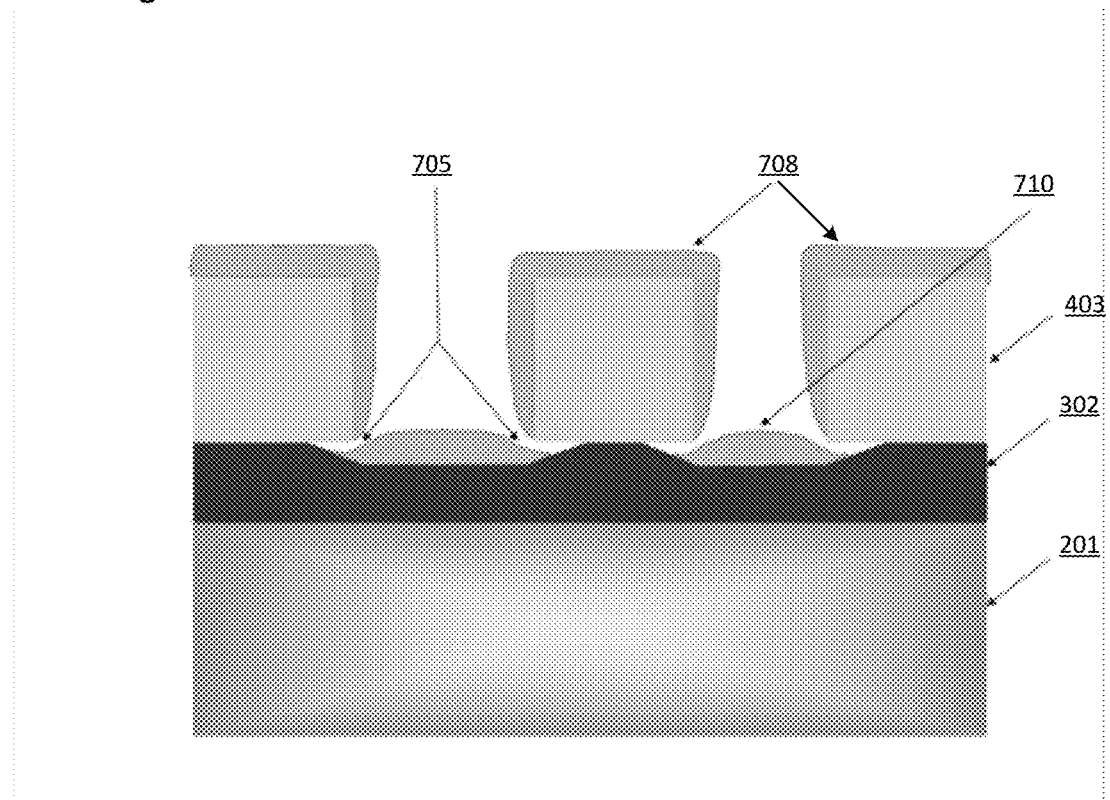
Figure 7A:
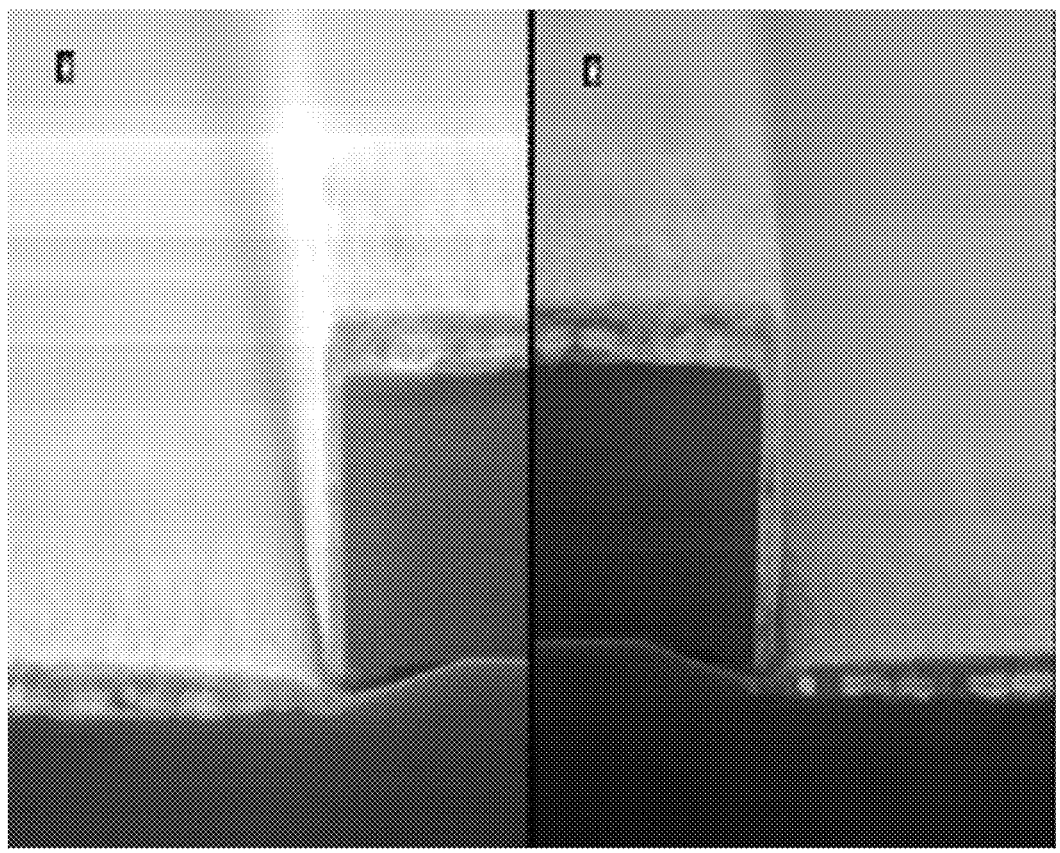

Referring now to FIG. 7, via metal deposition, a thin layer of primary metal 710 is shown as having been deposited on the surface of the oxide 302 and a thin layer of sacrificial metal 708 is shown as having been deposited on the surface of photoresist 403. The above-described metal discontinuities 705 that exist between primary metal layer 710 and sacrificial metal layer 708, under the photoresist edges, can also be seen. These discontinuities are caused by the oxide 302 having been etched out and undercut the photoresist 403 edge, which occurred as a result of the operations described with reference to FIG. 6. This undercut 605 feature of this new ILOPP process, which promotes easy and efficient separation of the sacrificial metal at Lift-Off, can be seen in the SEM images of FIG. 7A.

Figure 8:
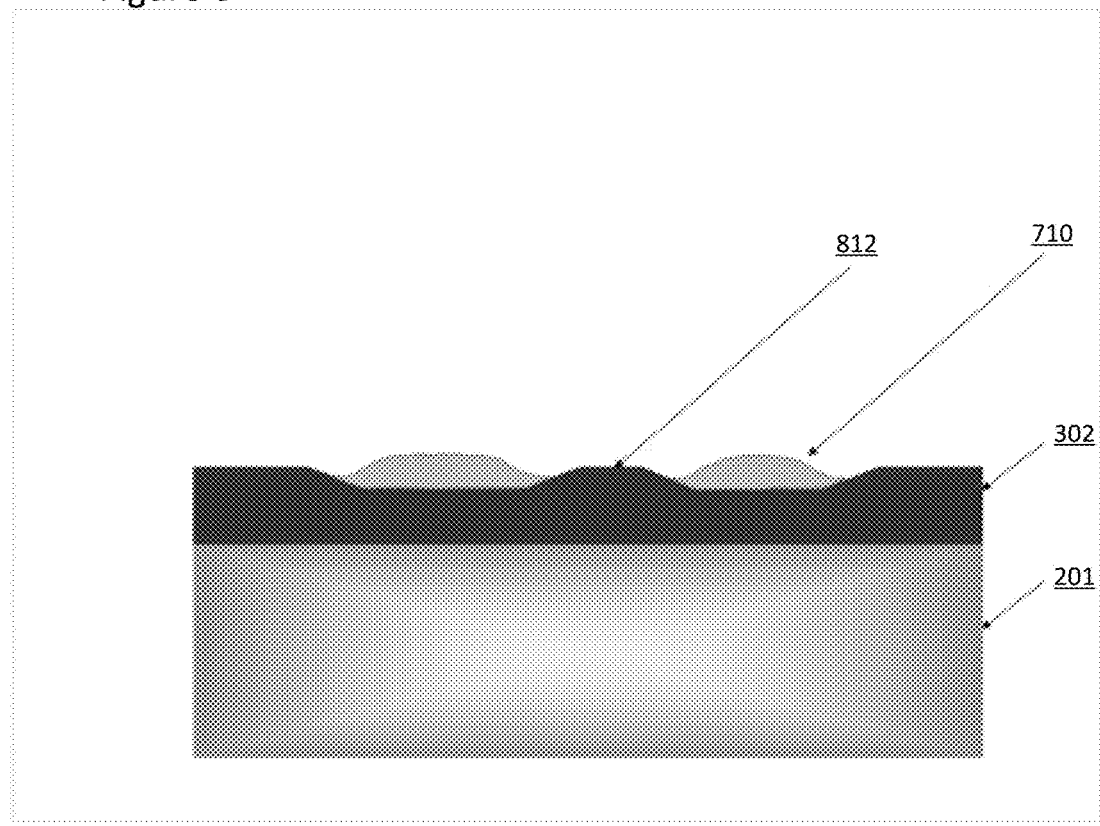

Referring now to FIG. 8, the sacrificial metal layer (708 of FIG. 7) is shown as having been removed at Lift-Off. Agitation in the chemical solvent solution during Lift-Off of the sacrificial metal layer is recommended in a preferred embodiment. As shown in the figure, primary metal layer 710 remains after Lift-Off. Also shown in the figure are oxide isolation areas 812 between portions of the primary metal layer 710, which oxide isolation areas were not previously etched. These isolation areas separate the primary metal lines that have rounded, smooth edges and high definition. It is to be noted that this ILOPP process gives the primary metal improved planarity with the oxide surface due to the primary metal being deposited in the oxide etched areas. This planarity of the surface metal is another benefit of this ILOPP process when additional layers of metal and oxide are required to increase connection densities.

Figure 9:
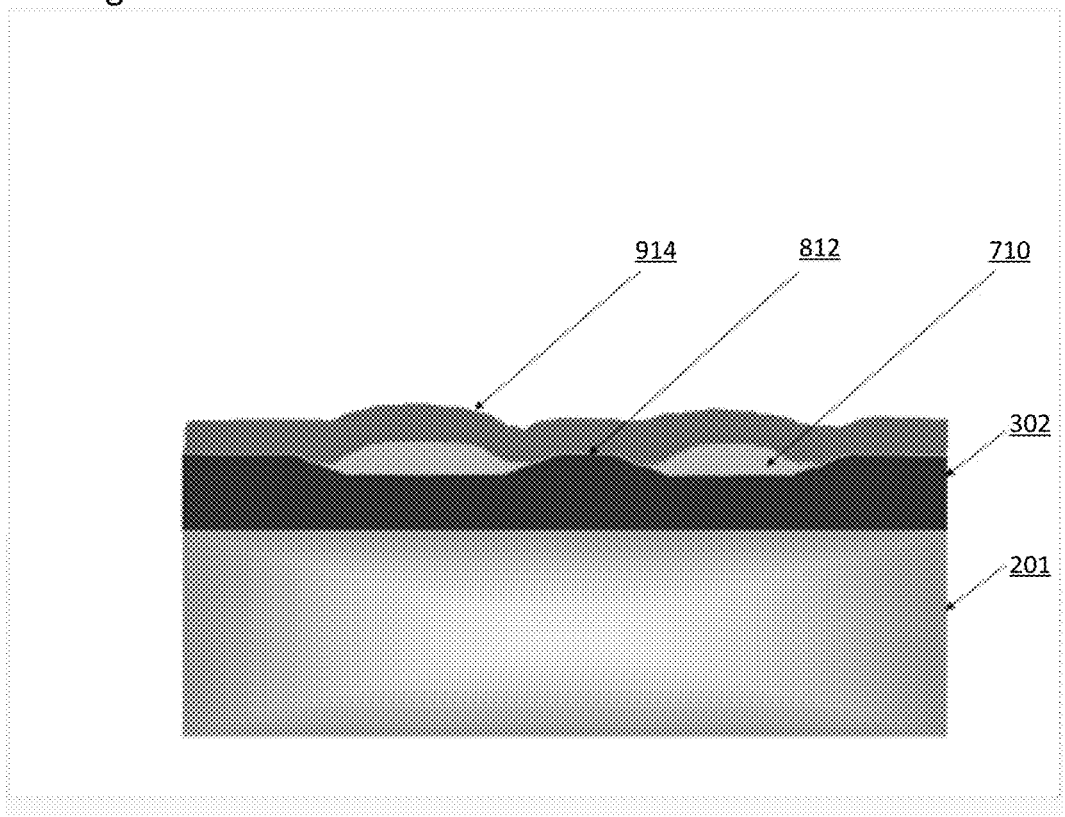

Referring now to FIG. 9, a layer of CVD oxide 914 is shown as having been deposited over the entire surface on the oxide isolation areas (812 of FIG. 8) and the surface of primary metal layer (710 of FIGS. 7 and 8). This CVD deposited oxide layer 914 serves as an isolation and protection layer for the primary metal and protects it from electrical shorts to subsequent metal layers. In addition, this CVD oxide layer 914 also provides a moisture barrier to stop corrosion of the primary metals.

Figure 10:
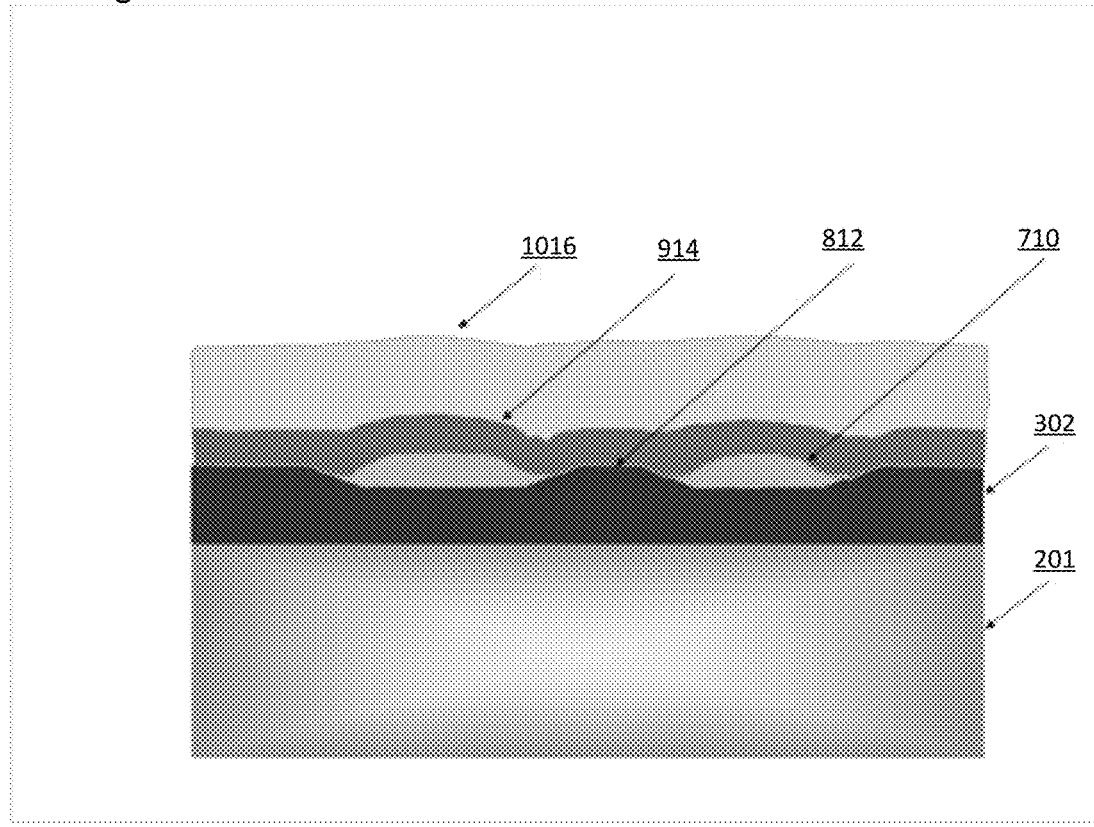

Referring now to FIG. 10, a layer of photoresist 1016 is shown as having been deposited on the CVD oxide layer 914. In this example, photoresist layer 1016 has been deposited using a photoresist spinner.

Figure 11:
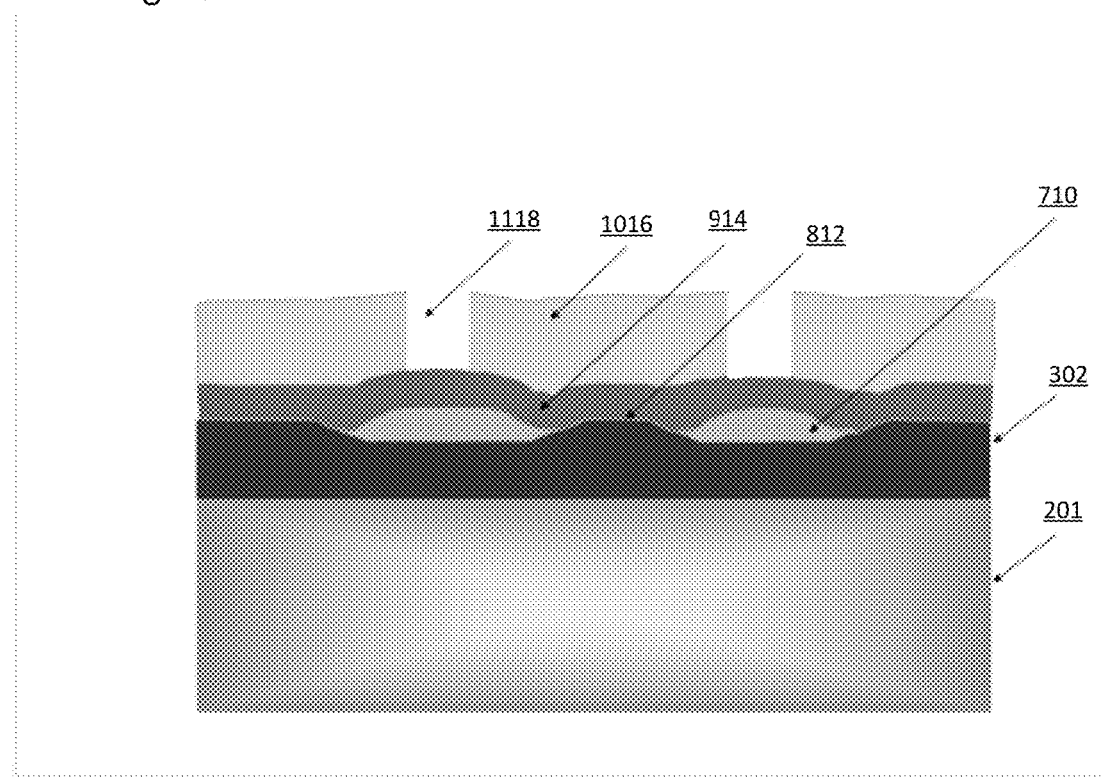

Referring now to FIG. 11, the layer of photoresist 1016 is shown as having gone through a masking, exposure, and development process resulting in exposed and developed areas 1118 of the photoresist 1016 where oxide 914 can then be etched out.

Figure 12:
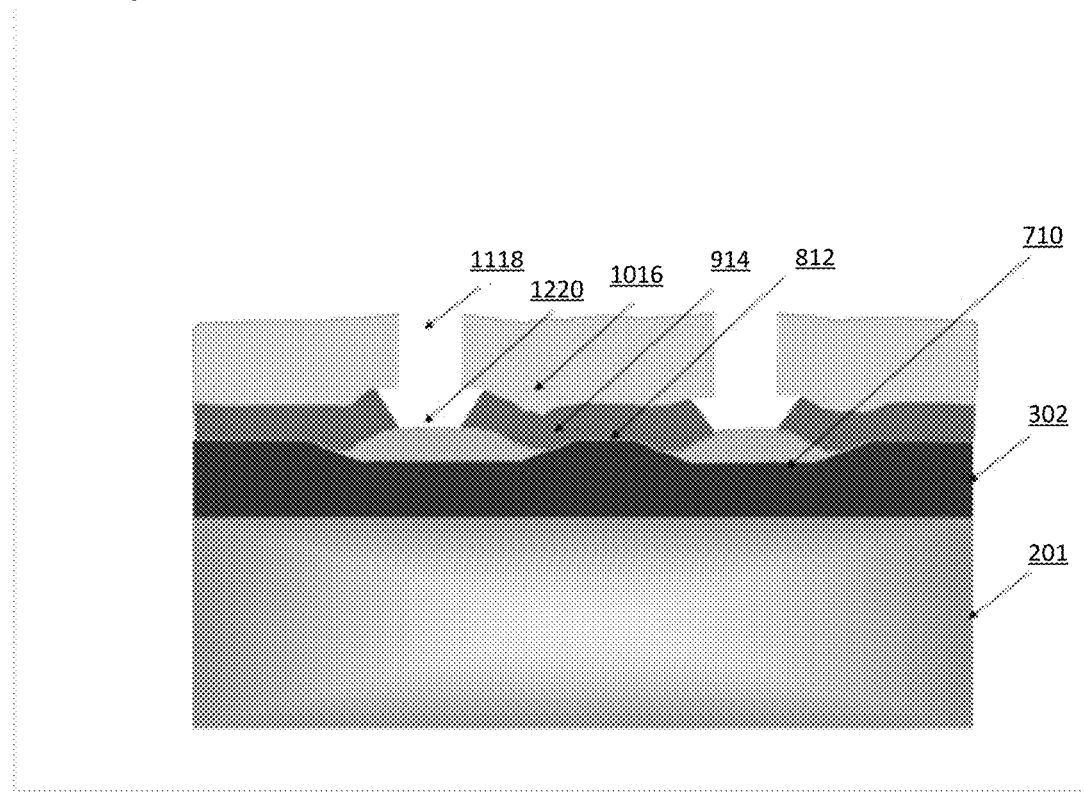

Referring now to FIG. 12, a contact area 1220 is shown, which is caused by the CVD oxide 914 having been etched out and down to the primary metal 710 via a wet or dry etch process. This example used a wet etched, isotropic, process but it could have been done using a dry etched, anisotropic, process. This opening allows contact to the primary metal for future layers that are to be deposited.

Figure 13:
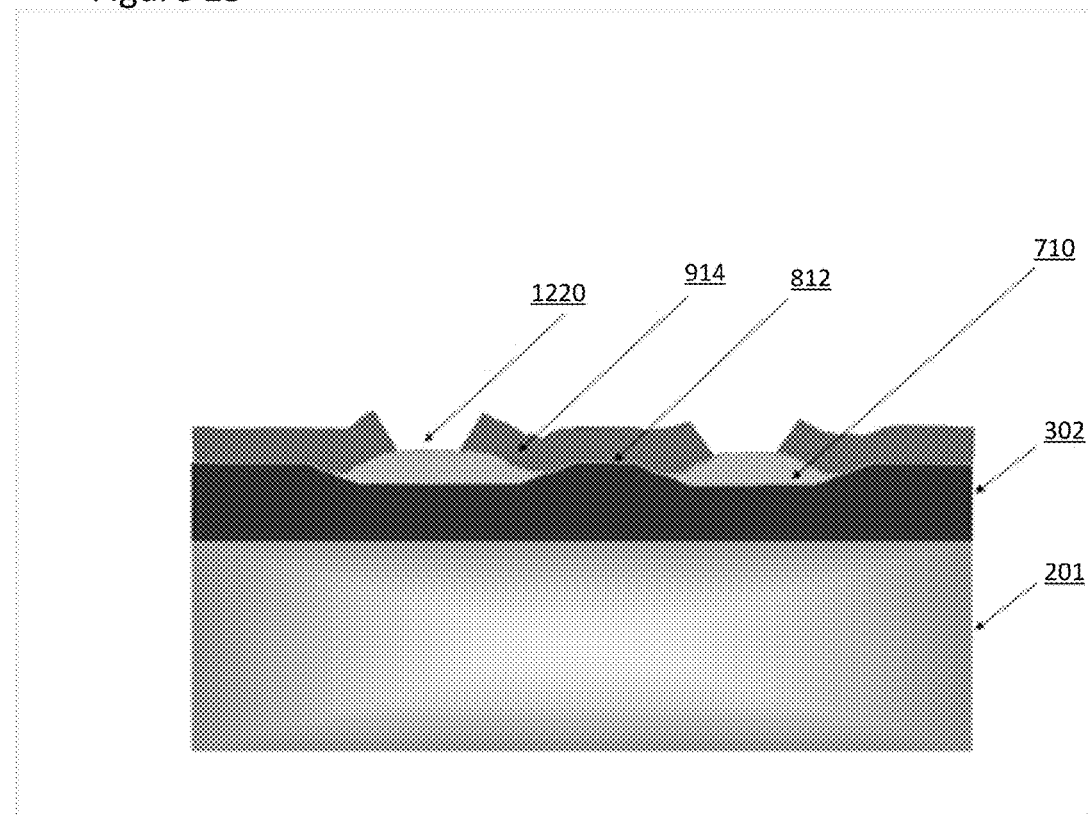

Referring now to FIG. 13, contact area 1220 that is used to contact future metals is again shown. Here, the photoresist (1016 of FIGS. 10, 11 and 12) has been stripped off and cleaned and the resulting structure is now ready for subsequent processing steps. The process can be continued from this point and new layers of metals and oxides can be added to the structure again using the new ILOPP process as desired.

Figure 14:
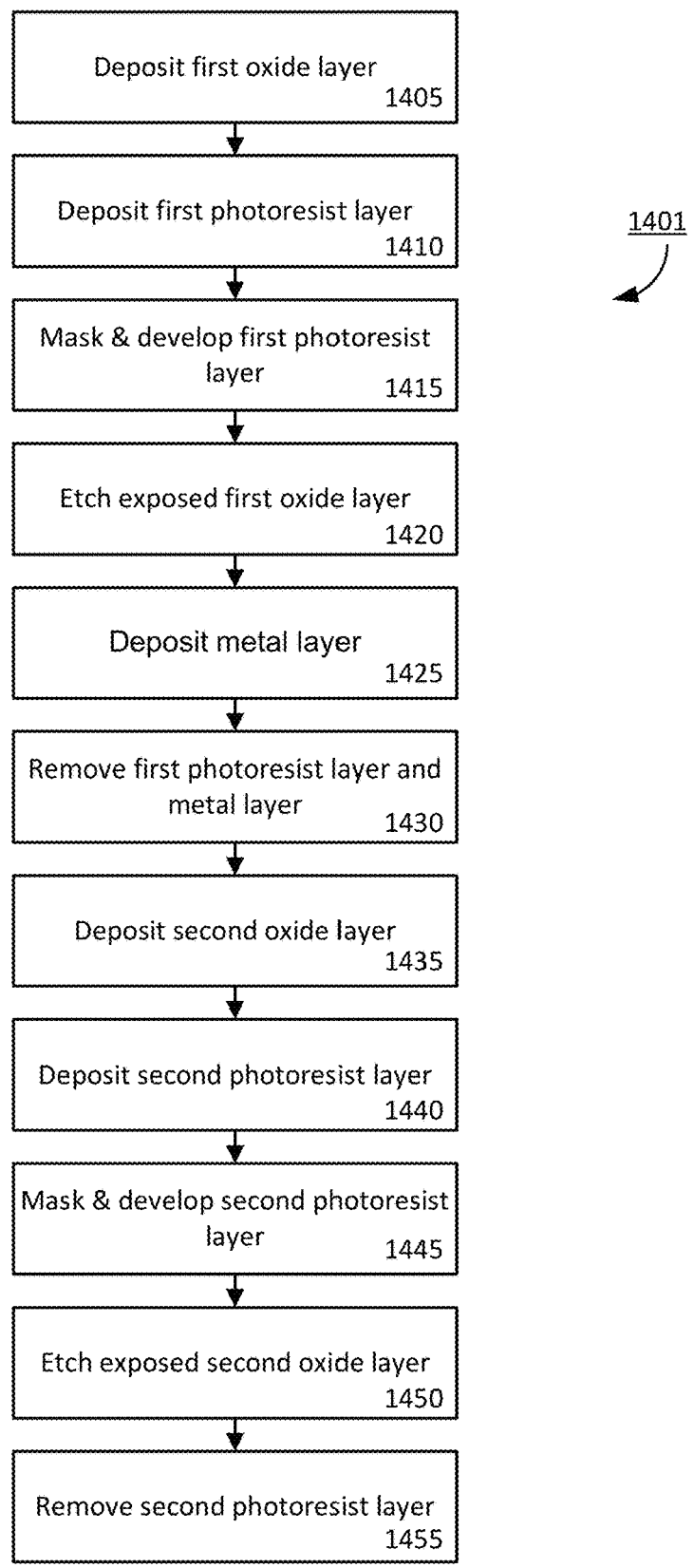
FIG. 14 is a flowchart of the ILOPP approach according to one or more embodiment.

Referring now to FIG. 14, a flowchart depicting one embodiment of the ILOPP process 1401 will now be explained.

In step 1405, a first layer of oxide is deposited on an existing substrate. It is to be understood that depositing a layer of oxide on an existing substrate can comprise depositing the layer of oxide directly on the substrate or, instead, on some existing layers or structures previously formed on the substrate. Step 1405 can be performed as was described with reference to FIG. 3.

In step 1410, a first layer of photoresist is deposited on the first layer of oxide. Step 1410 can be performed as was described with reference to FIG. 4.

In step 1415, the first layer of photoresist is masked and developed thereby exposing a surface of the first layer of oxide. Step 1415 can be performed as was described with reference to FIG. 5.

In step 1420, the exposed surface of the first layer of oxide is etched thereby creating an undercut area under an edge of the first layer of photoresist. Step 1420 can be performed as was described with reference to FIG. 6.

In step 1425, a layer of metal is deposited on the exposed surface of the first layer of oxide and on the first layer of photoresist with a discontinuity therebetween. Step 1425 can be performed as was described with reference to FIG. 7.

In step 1430, the first layer of photoresist and the layer of metal on the first layer of photoresist is removed using a Lift-Off process. Step 1430 can be performed as was described with reference to FIG. 8.

In step 1435, a second layer of oxide is deposited on the layer of metal on the exposed surface of the first layer of oxide and on the first oxide layer. Step 1435 can be performed as was described with reference to FIG. 9.

In step 1440, a second layer of photoresist is deposited on the second layer of oxide. Step 1440 can be performed as was described with reference to FIGS. 10.

In step 1445, the second layer of photoresist is masked and developed down thereby exposing a surface of the second layer of oxide. Step 1445 can be performed as was described with reference to FIG. 11.

In step 1450, the exposed surface of the second layer of oxide is etched down to the metal layer thereby creating a contact area on the metal area. Step 1450 can be performed as was described with reference to FIG. 12.

In step 1455, the second layer of photoresist is removed. Step 1455 can be performed as was described with reference to FIG. 13.

The ILOPP approach has now been described with reference to various figures. As has also now been described and shown, or will be clear to one of skill in the art in light of the teachings herein, the ILOPP approach has a number of benefits and advantages over known LOP approaches. Among those possible benefits and advantages are the following:

a. Improved efficiency of Lift-Off of the sacrificial metal.
b. Improved planarity due to depositing the primary metal in the oxide etched area.
c. An easier to control process due to the undercut under the photoresist rather than the known approach of relying on the photoresist wall profile.
d. Metal edge quality being smoother and tapered with higher definitions for single or multilayers of metal.
e. ILOPP is an inorganic process using oxide depth adjustment under the photoresist edge to generate an undercut.
f. Mechanical scrub, as used with known LOP approaches, is not required at "Lift-OFF".
g. Solvent penetration or development time is faster under the sacrificial photoresist due to the undercut separation between the two metal layers.
h. Sonication (ultrasonic breakup of the metal via a sonicator) at "Lift-Off" is not always required.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above. It will also be apparent that in some instances the order of steps described herein may be altered without changing the result or performance of all of the described steps.

Further, it should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc., or communicated over a computer network wherein the program instructions are sent over optical or electronic communication links. It should be noted that the order of the steps of the methods described herein may be altered and still be within the scope of the disclosure.

These and other variations upon the embodiments described and shown herein are intended to be covered by the present disclosure, which is limited only by the appended claims.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A semiconductor fabrication method comprising:
    depositing a first layer of oxide on a semiconductor substrate;
    depositing a first layer of photoresist on the first layer of oxide;
    masking and developing the first layer of photoresist thereby exposing a surface of the first layer of oxide;
    etching the exposed surface of the first layer of oxide thereby creating an undercut area under an edge of the first layer of photoresist;
    depositing a layer of metal on the exposed surface of the first layer of oxide and on the first layer of photoresist with a discontinuity therebetween;
    removing the first layer of photoresist and the layer of metal on the first layer of photoresist using a Lift-Off process;
    depositing a second layer of oxide on the layer of metal on the exposed surface of the first layer of oxide and on the first oxide layer;
    depositing a second layer of photoresist on the second layer of oxide;
    masking and developing the second layer of photoresist down thereby exposing a surface of the second layer of oxide;
    etching the exposed surface of the second layer of oxide down to the metal layer thereby creating a contact area on the metal layer; and,
    removing the second layer of photoresist.

2. The semiconductor fabrication method of claim 1 wherein depositing the first layer of oxide on a semiconductor substrate is done via a thermally grown inorganic oxide.

3. The semiconductor fabrication method of claim 1 wherein depositing the first layer of photoresist on the first layer of oxide is done using a photoresist spinner.

4. The semiconductor fabrication method of claim 1 wherein the first layer of photoresist has a high thermal stability.

5. The semiconductor fabrication method of claim 1 wherein etching the exposed surface of the first layer of oxide thereby creating the undercut area under the edge of the first layer of photoresist is done using a wet etch.

6. The semiconductor fabrication method of claim 1 wherein etching the exposed surface of the first layer of oxide thereby creating the undercut area under the edge of the first layer of photoresist is done to a depth that is similar to a thickness of the subsequently deposited layer of metal.

7. The semiconductor fabrication method of claim 1 wherein etching the exposed surface of the first layer of oxide thereby creating the undercut area under the edge of the first layer of photoresist is done using a Buffered Oxide Etch ("BOE") solution.

8. The semiconductor fabrication method of claim 1 wherein etching the exposed surface of the first layer of oxide thereby creating the undercut area under the edge of the first layer of photoresist is an isotropic etching.

9. The semiconductor fabrication method of claim 1 wherein depositing the layer of metal on the exposed surface of the first layer of oxide forms a primary metal layer and wherein depositing the layer of metal on the first layer of photoresist forms a sacrificial metal layer.

10. The semiconductor fabrication method of claim 1 wherein removing the first layer of photoresist and the layer of metal on the first layer of photoresist using a Lift-Off process is done via agitation in a chemical solvent solution.

11. The semiconductor fabrication method of claim 1 wherein removing the first layer of photoresist and the layer of metal on the first layer of photoresist using a Lift-Off process creates oxide isolation areas between portions of the first layer of metal on the first layer of oxide remaining after the Lift-Off process.

12. The semiconductor fabrication method of claim 1 wherein depositing a second layer of oxide on the layer of metal on the exposed surface of the first layer of oxide and on the first oxide layer is done using a Chemical Vapor Deposition (CVD) process.

13. The semiconductor fabrication method of claim 1 wherein depositing a second layer of photoresist on the second layer of oxide is done using a photoresist spinner.

14. The semiconductor fabrication method of claim 1 wherein etching the exposed surface of the second layer of oxide down to the metal layer thereby creating a contact area on the metal layer is done using a wet etched, isotropic, process.

* * * * *